(12) United States Patent
Silverbrook

(10) Patent No.: US 6,663,225 B2
(45) Date of Patent: Dec. 16, 2003

(54) FLUID EJECTING DEVICE HAVING A LAMINATED THERMAL BEND ACTUATOR

(75) Inventor: Kia Silverbrook, Balmain (AU)

(73) Assignee: Silverbrook Research Pty Ltd, Balmain (AU)

( * ) Notice: Subject to any disclaimer, the term of this patent is extended or adjusted under 35 U.S.C. 154(b) by 0 days.

(21) Appl. No.: 10/401,987

(22) Filed: Mar. 31, 2003

(65) Prior Publication Data
US 2003/0189620 A1 Oct. 9, 2003

Related U.S. Application Data

(63) Continuation of application No. 09/864,332, filed on May 25, 2001, now Pat. No. 6,540,331, which is a continuation of application No. 09/112,767, filed on Jul. 10, 1998, now Pat. No. 6,416,167, which is a continuation of application No. 09/112,768, filed on Jul. 10, 1998, now Pat. No. 6,243,113.

(30) Foreign Application Priority Data
Jul. 15, 1997 (AU) ............................................. PO7991
Mar. 25, 1998 (AU) ............................................. PO2592

(51) Int. Cl.[7] ................................................. B41J 2/04
(52) U.S. Cl. .......................................................... 347/54
(58) Field of Search ............................... 347/54, 68, 69, 347/70, 71, 72, 50, 40, 20, 44, 47, 27, 63; 399/261; 361/700; 310/328–330; 29/890.1

(56) References Cited

U.S. PATENT DOCUMENTS 6,598,960 B1 * 7/2003 Cabal et al.

\* cited by examiner

Primary Examiner—Raquel Yvette Gordon

(57) ABSTRACT

A fluid ejecting device includes a substrate containing drive circuitry. Nozzle chamber walls and a roof wall are positioned on the substrate to define a nozzle chamber in which fluid is received and a fluid ejection port from which the fluid is ejected, in use. A fluid ejecting mechanism is operatively arranged with respect to the nozzle chamber to act on the fluid in the nozzle chamber to eject fluid from the fluid ejection port. A thermal bend actuator is connected to the drive circuitry to receive an electrical signal from the drive circuitry and to provide actuation of the fluid ejecting mechanism. The thermal bend actuator has a laminated structure of at least three layers in the form of a pair of opposed, outer layers and at least one inner layer. The outer layers have substantially the same thermal expansion and elasticity characteristics.

5 Claims, 2 Drawing Sheets

FLUID EJECTING DEVICE HAVING A LAMINATED THERMAL BEND ACTUATOR

CROSS REFERENCES AND RELATED APPLICATIONS

This application is a continuation of U.S. application Ser. No. 09/864,332 file date May 25, 2001 now U.S. Pat. No. 6,540,331. Which is a con. of Ser. No. 09/112,767 filed Jul. 10, 1998, U.S. Pat. No. 6,416,167, which is a con. of Ser. No. 09/112,768 filed Jul. 10, 1998, U.S. Pat. No. 6,243,113.

FIELD OF THE INVENTION

This invention relates to a fluid ejecting device having a laminated thermal bend actuator.

BACKGROUND OF THE INVENTION

The applicant has invented a page width printhead which is capable of generating text and images of a resolution as high as 1600 dpi.

The printheads are manufactured in accordance with a technique that is based on integrated circuit fabrication. An example of such a technique is that which is presently used for the fabrication of micro-electromechanical systems.

These fabrication techniques allow the printhead to incorporate up to 84000 nozzle arrangements. The nozzle arrangements are electromechanically operated to achieve the ejection of ink.

In a number of the Applicant's inventions, the nozzle arrangements incorporate thermally actuated devices which are displaceable within nozzle chambers to eject the ink from the nozzle chambers. Many of the thermal actuators use a combination of materials and a bending action which results from an uneven expansion of the materials. The thermal actuators are manufactured by depositing consecutive layers of material having different coefficients of thermal expansion.

The present invention was conceived to address certain problems associated with such actuators. A significant problem with such actuators is that the different materials can result in bending and bending stresses being set up in the thermal actuator when the thermal actuator is inoperative and exposed to transient conditions. As is known in the field of integrated circuit fabrication, the deposition of material results in a heating of both the material being deposited and the material on which the deposition takes place. The fact that the materials have different thermal expansion characteristics can result in the bending of the laminated structure upon cooling. This is also the case where the materials have different elasticity characteristics. Those skilled in the field of micro electromechanical systems fabrication will appreciate that this is highly undesirable.

SUMMARY OF THE INVENTION

According to the invention, there is provided a fluid ejecting device which comprises
a substrate containing drive circuitry,
nozzle chamber walls and a roof wall positioned on the substrate to define a nozzle chamber in which fluid is received and a fluid ejection port from which the fluid is ejected, in use;
a fluid ejecting mechanism that is operatively arranged with respect to the nozzle chamber to act on the fluid in the nozzle chamber to eject fluid from the fluid ejection port;
a thermal bend actuator that is connected to the drive circuitry to receive an electrical signal from the drive circuitry and to provide actuation of the fluid ejecting mechanism,
wherein
the thermal bend actuator has a laminated structure of at least three layers in the form of a pair of opposed, outer layers and at least one inner layer, the outer layers having substantially the same thermal expansion and elasticity characteristics.

The thermal bend actuator may have a single inner layer.

The outer layers of the thermal bend actuator may each be conductive.

At least one of the outer layers of the thermal bend actuator may be connected to the drive circuitry so that said at least one of the outer layers can be heated.

The outer layers may have a higher coefficient of thermal expansion than the inner layer.

DETAILED DESCRIPTION OF THE INVENTION

Figure 1:
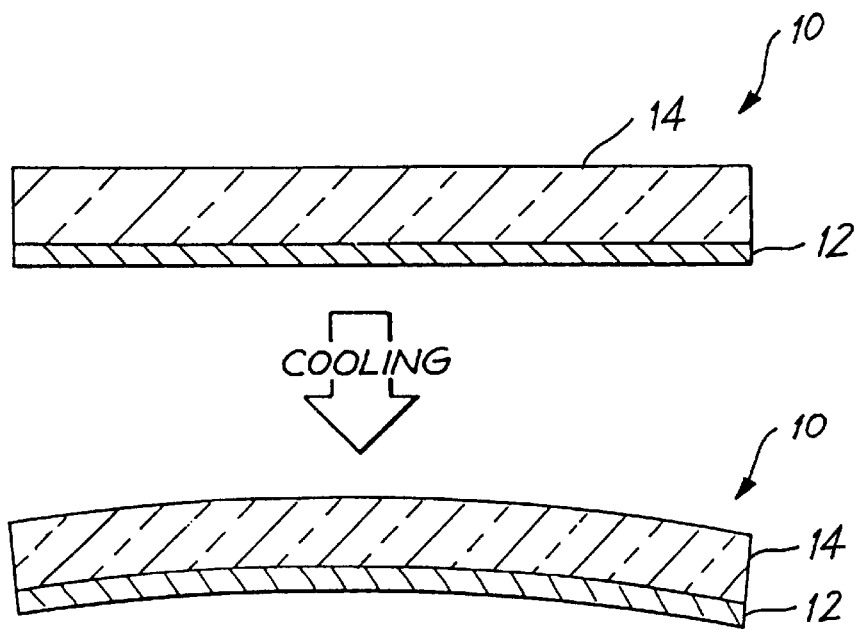
FIG. 1 shows two conditions of a thermal bend actuator of a fluid ejection device, not in accordance with the invention, and indicating the problem associated with such thermal bend actuators.

In FIG. 1, reference numeral 10 generally indicates an actuating mechanism in the form of a bi-layer thermal bend actuator.

As set out above, the device in which the thermal bend actuator 10 is to be incorporated is formed as part of an integrated circuit fabrication process. It follows that the thermal actuator 10 is manufactured in a deposition and etching process. Thus, once a first layer 12 has been deposited and prepared, a second layer 14 is deposited on the first layer 12. In order to operate correctly, one of the layers, in this case the first layer 14 is of a material having a higher coefficient of thermal expansion than the material of the second layer 12.

As is well known in the field of integrated circuit fabrication, deposition of material occurs at a temperature which is, of necessity, significantly higher than ambient temperature. This results in a heating of the first layer 12 and the deposited second layer 14.

Also, in order to operate, the layers 12, 14 are of materials which have different coefficients of thermal expansion. It follows that, upon cooling after deposition, thermal stresses are set up between the layers 12, 14 which can cause bending of the actuator 10. This is extremely undesirable, particularly in light of the fact that the actuators are manufactured on a micro-electromechanical scale.

Figure 2:
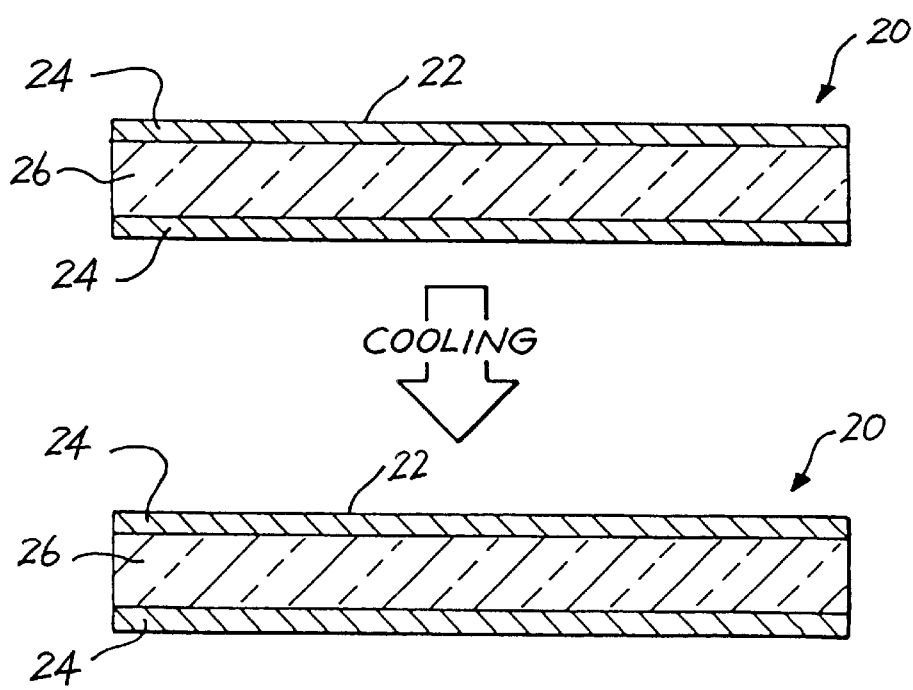
FIG. 2 shows a schematic view of a thermal bend actuator of a fluid ejection device, in accordance with the invention, and, in particular, the advantage associated with such a thermal bend actuator.

In FIG. 2, reference numeral 20 generally indicates an actuator mechanism of a fluid ejection device, in accordance with the invention.

The actuator mechanism 20 includes a thermal bend actuator 22 which has three layers in the form of a pair of opposed outer layers 24 and an inner layer 26.

The outer layers 24 are of substantially the same material and are of substantially the same dimensions. Further, the outer layers 24 are each conductive.

The outer layers 24 are of a material having a coefficient of thermal expansion which is such that, upon heating of any one of the layers 24, the actuator 22 bends to a degree sufficient to perform work. In particular, the outer layers 24 can be of any material having a suitable Young's modulus and coefficient of thermal expansion. Possible materials are titanium nitride and a copper nickel alloy.

The inner layer 26 can be any suitable insulating material such as glass (amorphous silicon dioxide) or even air.

It will be appreciated that the thermal bend actuator 22 will find application in any micro electromechanical system in which a prime mover is required. Thus, at least one of the outer layers 24 is connectable to drive circuitry of such a micro electromechanical device.

Figure 3:
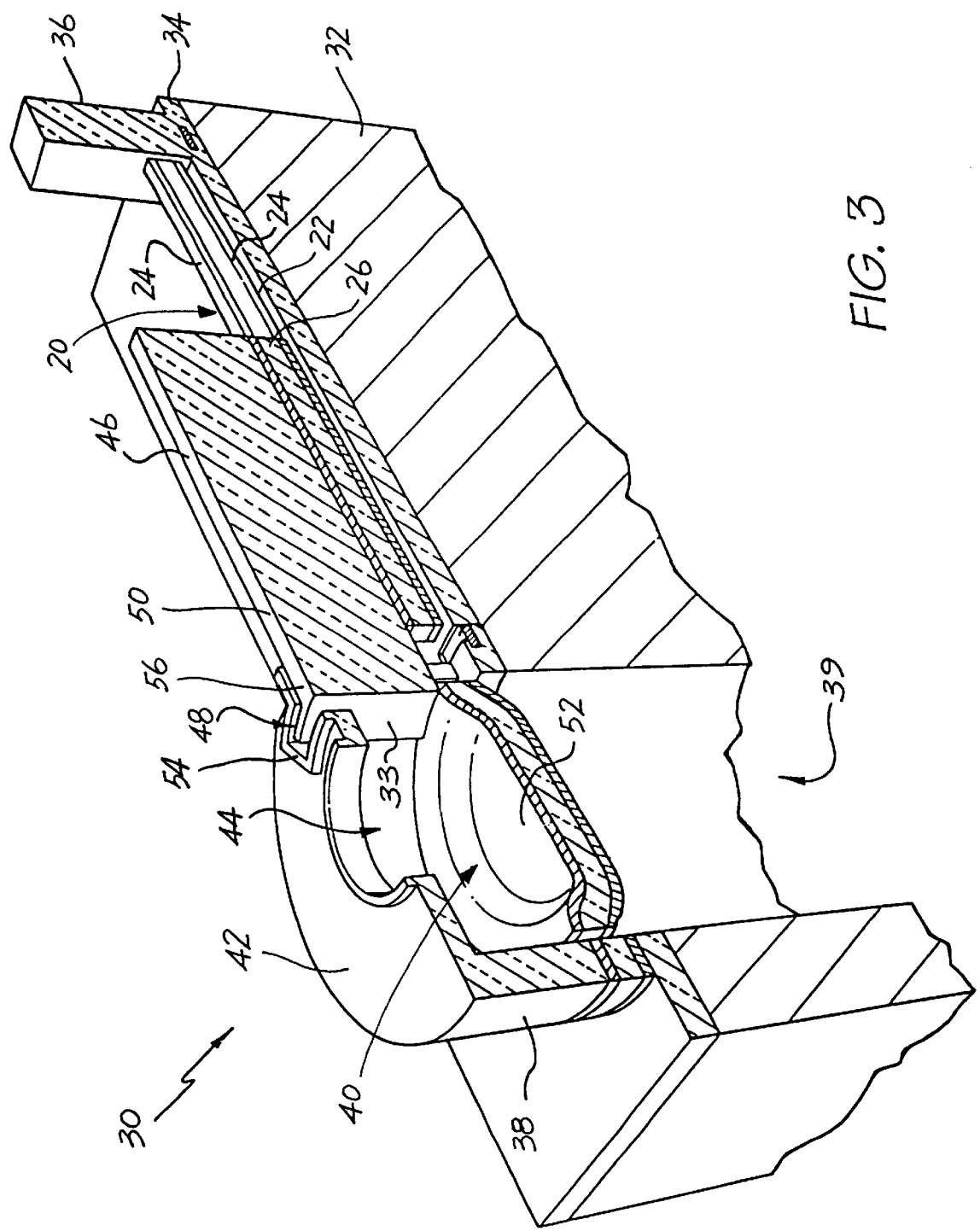
FIG. 3 shows a fluid ejection device in accordance with the invention.

In FIG. 3, reference numeral 30 generally indicates a fluid ejection device in accordance with the invention. In this embodiment, the fluid ejection device is in the form of a nozzle arrangement of an ink jet printhead, which includes the actuating mechanism 20.

It is to be appreciated that reference to the nozzle arrangement 30 is for illustrative purposes and should not be construed as limiting the invention to this particular embodiment.

The nozzle arrangement 30 is formed on a wafer substrate 32 in a successive deposition and etching process which forms part of an integrated circuit fabrication technique conventionally used in the manufacture of micro electromechanical systems.

In this particular example, the nozzle arrangement 30 is formed on a drive circuitry layer 34 which, itself, is formed on the wafer substrate 32.

A support post 36 extends from the drive circuitry layer 34. The thermal bend actuator 22 is mounted, cantilever-fashion, on the support post 36. One of the outer layers 24 is in electrical contact with the drive circuitry layer 34 so that movement of the bend actuator 22 can be achieved with a control system (not shown) connected to the drive circuitry layer 34.

A cylindrical wall 38 is formed on the drive circuitry layer 34 to define a nozzle chamber 40. A roof wall 42 is arranged on the cylindrical wall 38 and defines an ink ejection port 44 from which ink is ejected out of the nozzle chamber 40. An ink ejection member 46 is mounted on the thermal bend actuator 22 and extends through a slot 48 defined in the cylindrical wall 38. The ink ejection member 46 includes an arm 50 and a paddle 52 mounted on the arm 50 and being shaped to correspond generally with a cross-sectional dimension of the nozzle chamber 40.

The slot 48 in the cylindrical wall 38 is shaped to define a guide formation 54 in the cylindrical wall 38. An end of the arm 50 on which the paddle 52 is mounted is shaped to correspond with the guide formation 54. In particular, the guide formation 54 and the end 56 of the arm 50 are shaped so that, on bending of the bend actuator 22, movement of the end 56 and hence the paddle 52 is retained along a linear path.

The nozzle arrangement 30 is one of a plurality of nozzle arrangements formed on the wafer substrate 32 to deft the ink jet printhead of the invention. It is simply for reasons of clarity and ease of description that a single nozzle arrangement is shown in the accompanying drawings.

It will be appreciated that, due to the fact that each nozzle arrangement is a micro-electromechanical device and that up to 84000 such nozzle arrangements may be required for a single printhead, accuracy and consistency of manufacture of each nozzle arrangement is extremely important. It would therefore be highly disadvantageous if, upon cooling after deposition, the thermal bend actuator 22 became bent or warped. This would result in an uneven positioning of the paddles 52 within the nozzle chambers 40.

Applicant submits that the fact that the two opposed outer layers 24 have the same thermal expansion and elasticity characteristics results in stability of the bend actuator 22 upon cooling after deposition. In this manner, consistently straight bend actuators 22 can be achieved.

A further advantage that has been identified by the Applicant is that, in general operation, the substantially identical outer layers 24 of the thermal actuator 22 provide a high level of thermal stability. This allows the thermal actuator 22 to be operated repeatedly in spite of the fact that all the heat from previous activations has not yet dissipated.

What is claimed is:

1. A fluid ejecting device which comprises a substrate containing drive circuitry, nozzle chamber walls and a roof wall positioned on the substrate to define a nozzle chamber in which fluid is received and a fluid ejection port from which the fluid is ejected, in use;

a fluid ejecting mechanism that is operatively arranged with respect to the nozzle chamber to act on the fluid in the nozzle chamber to eject fluid from the fluid ejection port;

a thermal bend actuator that is connected to the drive circuitry to receive an electrical signal from the drive circuitry and to provide actuation of the fluid ejecting mechanism, wherein the thermal bend actuator has a laminated structure of at least three layers in the form of a pair of opposed, outer layers and at least one inner layer, the outer layers having substantially the same thermal expansion and elasticity characteristics.

2. A fluid ejecting device as claimed in claim 1, in which the thermal bend actuator has a single inner layer.

3. A fluid ejecting device as claimed in claim 1, in which the outer layers of the thermal bend actuator are each conductive.

4. A fluid ejecting device as claimed in claim 3 in which at least one of the outer layers of the thermal bend actuator is connected to the drive circuitry so that said at least one of the outer layers can be heated.

5. A fluid ejecting device as claimed in claim 1, in which the outer layers have a higher coefficient of thermal expansion than the inner layer.

* * * * *